United States Patent
Yoneya et al.

(10) Patent No.: US 8,369,151 B2
(45) Date of Patent: Feb. 5, 2013

(54) NONVOLATILE SEMICONDUCTOR MEMORY DEVICE

(75) Inventors: Kazuhide Yoneya, Sagamihara (JP); Kenji Tsuchiya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 415 days.

(21) Appl. No.: 12/814,840

(22) Filed: Jun. 14, 2010

(65) Prior Publication Data

US 2010/0322008 A1    Dec. 23, 2010

(30) Foreign Application Priority Data

Jun. 18, 2009  (JP) ................................. 2009-144984

(51) Int. Cl.
  *G11C 11/34* (2006.01)
(52) U.S. Cl. ..................... 365/185.18; 365/148; 365/158
(58) Field of Classification Search ............. 365/185.18, 365/148, 158
  See application file for complete search history.

(56) References Cited

U.S. PATENT DOCUMENTS 7,974,117 B2 * 7/2011 Tan et al. ....................... 365/148
2008/0130352 A1 * 6/2008 Scheuerlein .................. 365/163

FOREIGN PATENT DOCUMENTS

JP      2-62630       3/1990
JP    2002-229809     8/2002

* cited by examiner

*Primary Examiner* — Anthan Tran
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array including regular memory cells and permanent memory cells and a control circuit. The regular memory cells are capable of switching between a first data storage state and a second data storage state. The permanent memory cells are fixed in a third data storage state that is read as the same logic level data as the first storage state. Data is stored in at least one of the regular memory cells and at least one of the permanent memory cells. The control circuit rewrites at least one of the regular memory cells from the second data storage state to the first data storage state at the time of data holding. The control circuit performs a reading operation after rewriting the regular memory cells from the first data storage state to the second data storage state.

20 Claims, 12 Drawing Sheets

VSHORT > VSET > VRESET

Data state at the time of writing: 0-1-1-0-0-0-1-0

Data state at the time of holding: 1-1-1-1-1-1-1-1

Data state at the time of reading: 0-1-1-0-0-0-1-0

NONVOLATILE SEMICONDUCTOR MEMORY DEVICE

CROSS REFERENCE TO RELATED APPLICATIONS

This application is based upon and claims the benefit of priority from the prior Japanese Patent Application No. 2009-144984, filed on Jun. 18, 2009, the entire contents of which are incorporated herein by reference.

BACKGROUND

1. Field

Embodiments described herein relate generally to a nonvolatile semiconductor memory device.

2. Description of the Related Art

As one of the electrically-rewritable nonvolatile semiconductor memories (EEPROMs), a NAND-type EEPROM that can be highly integrated is well known. In the NAND-type EEPROM, data rewriting is normally performed by injecting electrons into and releasing electrons from a floating gate via an oxide film much thinner than the gate oxide film that is used in a conventional MOSFET. Higher-density EEPROMs have been realized through miniaturization achieved by the advanced processing technology and device technology. However, the miniaturization of the EEPROMs of the floating gate type is approaching its limit these days.

In view of this, resistive memory devices have attracted increased attention as a likely candidate for replacing semiconductor memory devices that use a MOSFET as a memory cell. As described herein, it is assumed that the resistive memory devices include Resistive RAM (ReRAM), in a narrow sense, that uses a transition metal oxide as a recording layer and stores its resistance states in a non-volatile manner, as well as Phase Change RAM (PCRAM) that uses chalcogenide or the like as a recording layer to utilize the resistance information of crystalline states (conductors) and amorphous states (insulators), and so on.

Two kinds of types of variable resistive elements in resistive memory devices are known. In one kind, known as a bipolar type, a high-resistance state and a low-resistance state are set by switching a polarity of an applied voltage. In the other kind, known as a unipolar type, setting of the high-resistance state and the low-resistance state are made possible by controlling a voltage value and a voltage application time, without switching the polarity of the applied voltage.

The unipolar type is preferable for realizing a high-density memory cell array. This is because, in the case of the unipolar type, the cell array can be configured by overlapping a variable resistive element and a rectifier element such as a diode at intersecting portions of bit lines and word lines, without using a transistor. Furthermore, arranging such memory cell arrays three-dimensionally in stacks enables a large capacity to be realized without causing an increase in cell array area.

In the case of unipolar type ReRAM, write of data to a memory cell is performed by applying for a short time to the variable resistive element a certain voltage. As a result, the variable resistive element changes from the high-resistance state to the low-resistance state. Hereinafter, this operation to change the variable resistor from the high-resistance state to the low-resistance state is called a setting operation. In contrast, erase of data in a memory cell is performed by applying for a long time to the variable resistive element in the low-resistance state subsequent to the setting operation a certain voltage lower than that applied during the setting operation. As a result, the variable resistive element changes from the low-resistance state to the high-resistance state. Hereinafter, this operation to change the variable resistive element from the low-resistance state to the high-resistance state is called a resetting operation.

Where confidential data (such as telephone numbers and personal identification numbers) is stored with the use of nonvolatile memory cells as in a NAND-type EEPROM or a resistive memory device, the data needs to be undisclosed for confidentiality reasons, and should not be easily read from outside. Therefore, various measures have been taken. For example, confidential data is encrypted, reading is allowed only by a special command, or physical partitions are provided (see Japanese Patent Application Laid-Open Nos. 2-62630 and 2002-229809, for example).

With the use of encryption or a special command, data stored in a confidential data region can be protected from outside. In such a case, however, a special circuit region to cope with encryption or a special command needs to be provided inside the chip. To further improve the protection performance for confidential data, the circuit becomes more and more complicated, and the proportion of the circuit in the chip becomes larger. As a result, the chip size becomes larger.

DETAILED DESCRIPTION

According to one embodiment, a nonvolatile semiconductor memory device includes a memory cell array including regular memory cells and permanent memory cells and a control circuit. The regular memory cells are capable of switching between a first data storage state and a second data storage state by electric rewriting. The permanent memory cells are not to be electrically rewritten and are fixed in a third data storage state that is read as the same logic level data as the first storage state. The control circuit controls data rewriting into the memory cell array, data holding in the memory cell array, and data reading from the memory cell array. Data to be written into the memory cell array is stored in at least one of the regular memory cells and at least one of the permanent memory cells in the memory cell array. The control circuit rewrites at least one of the regular memory cells from the second data storage state to the first data storage state at the time of data holding. The control circuit performs a reading operation after rewriting the regular memory cells from the first data storage state to the second data storage state at the time of data reading.

Embodiments of the present invention will be described below with reference to the accompanying drawings.

FIRST EMBODIMENT

[Entire Structure of Nonvolatile Semiconductor Memory Device According to First Embodiment]

Figure 1:
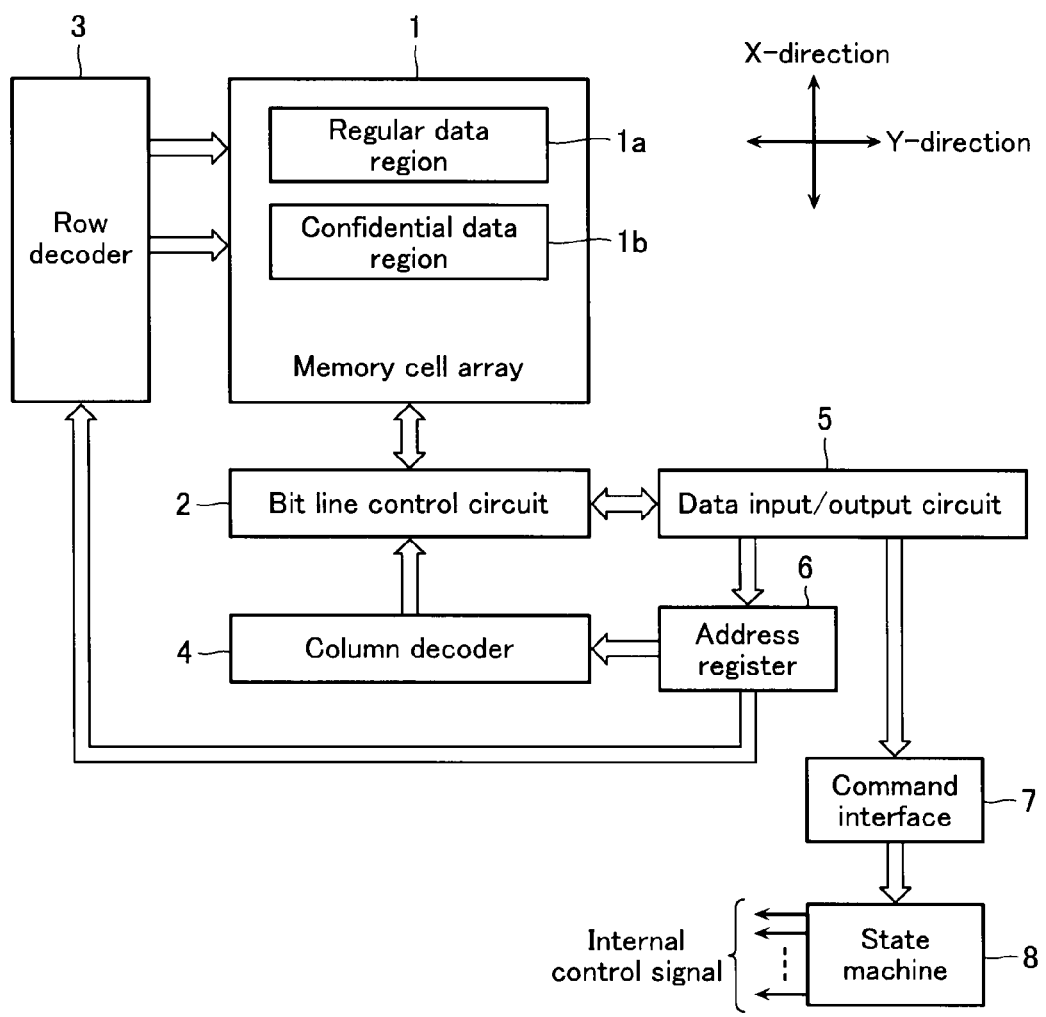
FIG. 1 is a block diagram of a nonvolatile semiconductor memory device according to a first embodiment of the present invention.

Referring to FIG. 1, the entire structure of a nonvolatile semiconductor memory device according to an embodiment of the present invention is first described. In the first embodiment, the nonvolatile semiconductor memory device is described as a resistive memory device that includes variable resistive elements VR as memory cells MC as described later. FIG. 1 is a block diagram of the nonvolatile semiconductor memory device according to this embodiment of the present invention. The nonvolatile semiconductor memory device according to this embodiment includes a memory cell array 1 and peripheral circuits as a control circuit that performs control operations such as data rewriting, holding, and reading.

The memory cell array 1 includes a regular data region 1a and a confidential data region 1b. Although the regular data region 1a and the confidential data region 1b are provided independently of each other in FIG. 1, any part of the memory cell array 1 having the memory cells MC arranged therein may be set as either of the data regions in practice. In other words, the region where predetermined confidential data is written by a user designation is the confidential data region 1b.

A bit line control circuit 2 controls the bit lines BL of the memory cell array 1, and performs data erasing in the memory cells MC, data writing into the memory cells MC, and data reading from the memory cells MC. A column decoder 4 selectively drives a bit line BL via the bit line control circuit 2, based on an address signal supplied from outside.

A row decoder 3 selects a word line WL of the memory cell array 1, and applies the voltage necessary for data erasing in the memory cells MC, data writing into the memory cells MC, and data reading from the memory cells MC.

A data input/output circuit 5 is connected to an external host (not shown) via an input/output (I/O) line, and performs write data receiving, erase command receiving, read data outputting, and address/command data receiving. The data input/output circuit 5 also transmits received write data to the bit line control circuit 2, and receives and outputs data read from the bit line control circuit 2 to the outside. Each address supplied from the outside to the data input/output circuit 5 is sent to the row decoder 3 and the column decoder 4 via an address register 6. Each command supplied to the data input/output circuit 5 is supplied to a state machine 8 via a command interface 7. The state machine 8 performs various control operations such as data rewriting, holding, and reading, upon receipt of a command from a host. These peripheral circuits other than the memory cell array 1 constitute the control circuit in this embodiment.

The peripheral circuits other than the memory cell array 1 may be formed on a semiconductor substrate located immediately below the stacked memory cell array 1. With this arrangement, the chip area of the nonvolatile semiconductor memory device can be made substantially equal to the area of the memory cell array 1.

[Circuit Structure of Memory Cell Array 1 According to First Embodiment]

Figure 2:
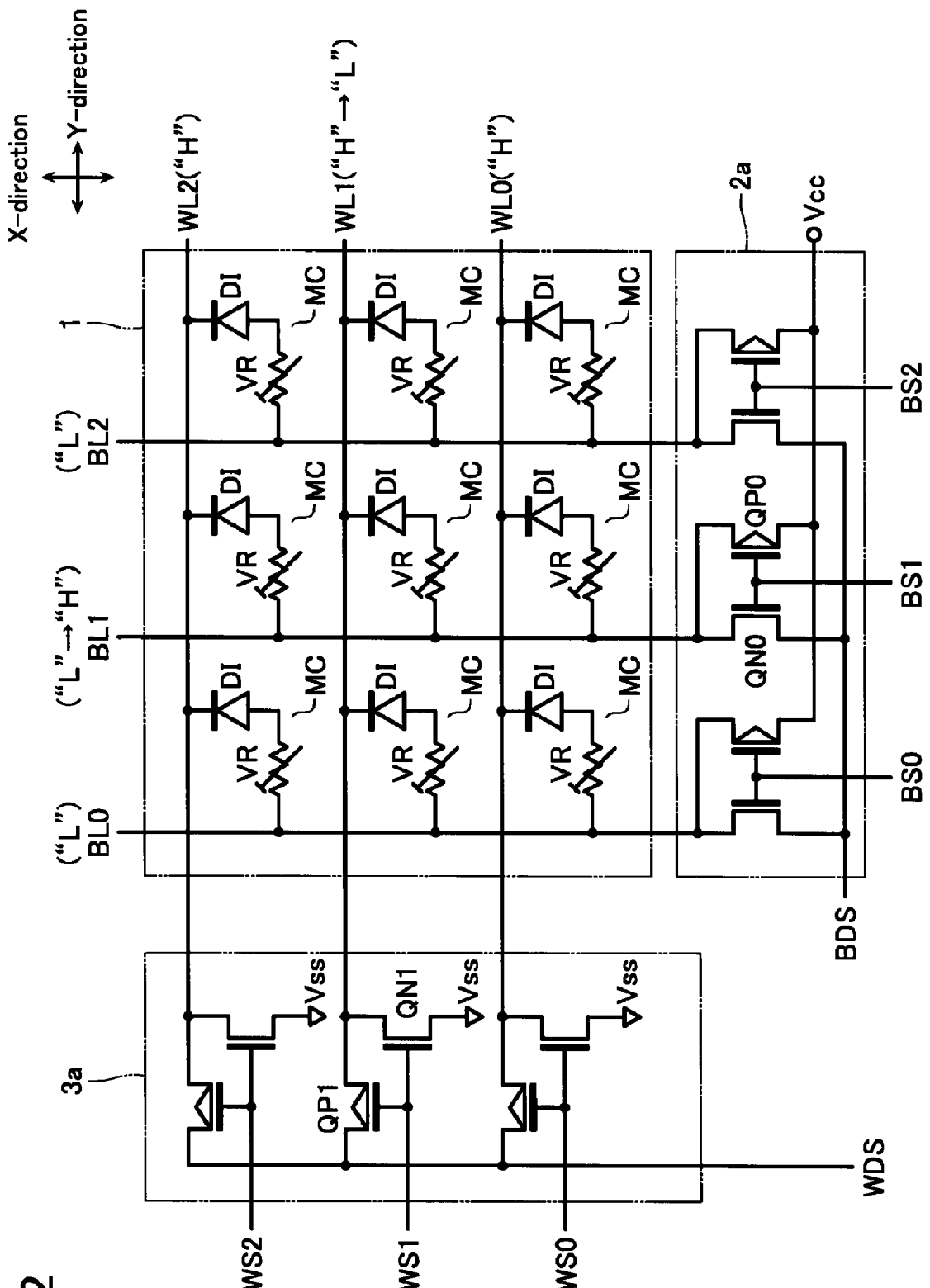
FIG. 2 is a circuit diagram of a memory cell array and peripheral circuits of the nonvolatile semiconductor memory device according to the first embodiment.

Next, the circuit structure of the memory cell array 1 according to this embodiment is described. FIG. 2 is a circuit diagram of the memory cell array 1 and peripheral circuits that are a select circuit 2a (part of the bit line control circuit 2) and a select circuit 3a (part of the row decoder 3).

The memory cell array 1 includes the word lines WL (WL0 to WL2), the bit lines BL (BL0 to BL2), and the memory cells MC connected to the intersecting portions between the word lines WL and the bit lines BL. The word lines WL0 to WL2 are arranged at predetermined intervals in the X-direction, and are designed to extend in the Y-direction. The bit lines BL0 to BL2 are arranged at predetermined intervals in the Y-direction, and are designed to extend in the X-direction. The memory cells MC are arranged in the direction in which the bit lines BL extend (the X-direction shown in FIG. 2) and in the direction in which the word lines WL extend (the Y-direction shown in FIG. 2). The plurality of memory cells MC are arranged in a two-dimensional matrix fashion. As shown in FIG. 2, the memory cells MC of a variable resistance type each having a rectifier elements, for example, diode DI and a variable resistive element VR connected in series are arranged at the intersecting portions between the word lines WL and the bit lines BL. The anode side of each diode DI is connected to each corresponding bit line BL via each corresponding variable resistive element VR, and the cathode side of each diode DI is connected to each corresponding word line WL. Here, the arrangement and polarities of the diodes DI and the variable resistive elements VR included in the memory cells MC are not limited to those shown in FIG. 2.

One end of each bit line BL is connected to the select circuit 2a. The select circuit 2a is formed with select PMOS transistors QP0 and select NMOS transistors QN0 that are provided on the respective bit lines BL and have gates and drains commonly connected. The source of each of the select PMOS transistors QP0 is connected to a high-potential power supply Vcc. The source of each of the select NMOS transistors QN0 is connected to a bit-line drive sense line BDS that applies a write pulse and supplies a current to be detected at the time of data reading. The common drains of the transistors QP0 and QN0 are connected to the bit lines BL, and bit-line select signals BSi (i being 0 to 2) to select the bit lines BL are supplied to the common gates of the transistors QP0 and QN0.

One end of each of the word lines WL is connected to the select circuit 3a. The select circuit 3a is formed with select PMOS transistors QP1 and select NMOS transistors QN1 that are provided on the respective word lines WL and have gates and drains commonly connected. The source of each of the select NMOS transistors QN1 is connected to a low-potential power supply Vss. The source of each of the select PMOS transistors QP1 is connected to a word-line drive sense line WDS that applies a write pulse and supplies a current to be detected at the time of data reading. The common drains of the transistors QP1 and QN1 are connected to the word lines WL, and word-line select signals/WSi (i being 0 to 2) to select the word lines WL are supplied to the common gates of the transistors QP1 and QN1.

For example, when various operations are to be performed on the memory cell MC connected to the bit line BL1 and the word line WL1 in FIG. 2, the word line WL1 is changed from "H" to "L", and the other word lines WL0 and WL2 are held at "H". Also, the bit line BL1 is changed from "L" to "H", and the other bit lines BL0 and BL2 are held at "L".

In the above example, a memory cell MC is selected independently of the others. However, in a case where the data stored in the memory cells MC connected to the selected word line WL1 is collectively read, sense amplifiers are provided for the respective bit lines BL0 to BL2. In such a case, the bit lines BL0 to BL2 are connected to the respective sense amplifiers via the select circuit 2a, based on the bit-line select signals BSi. In the memory cell array 1, the polarity of each diode DI may be reversed from that in the circuit illustrated in FIG. 2, and current may flow from the word lines WL to the bit lines BL.

[Stack Structure of Memory Cell Array 1]

Figure 3:
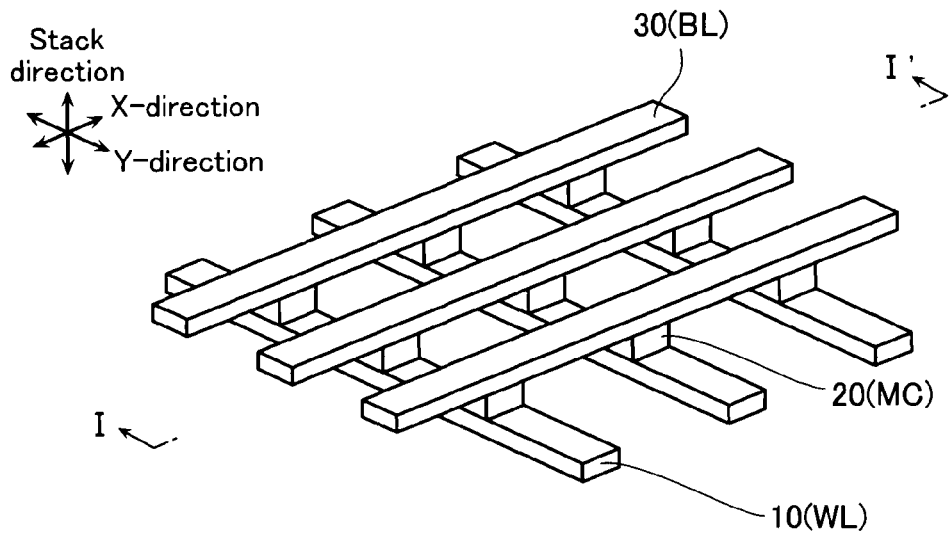
FIG. 3 is a perspective view of part of the memory cell array 1 of the nonvolatile semiconductor memory device according to the first embodiment.

Referring now to FIG. 3, the stack structure of the memory cell array 1 is described. FIG. 3 is a schematic perspective view showing the stack structure of the memory cell array 1. As shown in FIG. 3, the memory cell array 1 includes a first wiring layer 10 that functions as the word lines WL (WL0 to WL2), a memory layer 20 that functions as the memory cells MC, and a second wiring layer 30 that functions as the bit lines BL (BL0 to BL2).

As shown in FIG. 3, the first wiring layer 10 is designed to extend in the Y-direction at predetermined intervals in the X-direction. The first wiring layer 10 is preferably made of a heat-resistant, low-resistance material, such as tungsten (W), tungsten silicide (WSi), nickel silicide (NiSi), or cobalt silicide (CoSi).

As shown in FIG. 3, the memory layer 20 is formed in pillar-like shapes on the upper face of the first wiring layer 10. The memory layer 20 is formed in a matrix fashion at predetermined intervals in the X- and Y-directions.

As shown in FIG. 3, the second wiring layer 30 is formed on the upper faces of the memory layer 20 aligned in the X-direction. The second wiring layer 30 is designed to extend in the X-direction at predetermined intervals in the Y-direction. The second wiring layer 30 is preferably made of a heat-resistant, low-resistance material, such as tungsten (W), tungsten silicide (WSi), nickel silicide (NiSi), or cobalt silicide (CoSi).

The nonvolatile semiconductor memory device according to this embodiment has a three-dimensional memory cell array structure in which the memory cell arrays 1 are stacked. In this case, at least either the bit lines BL or the word lines WL may be shared between each two upper and lower layers.

Figure 4:
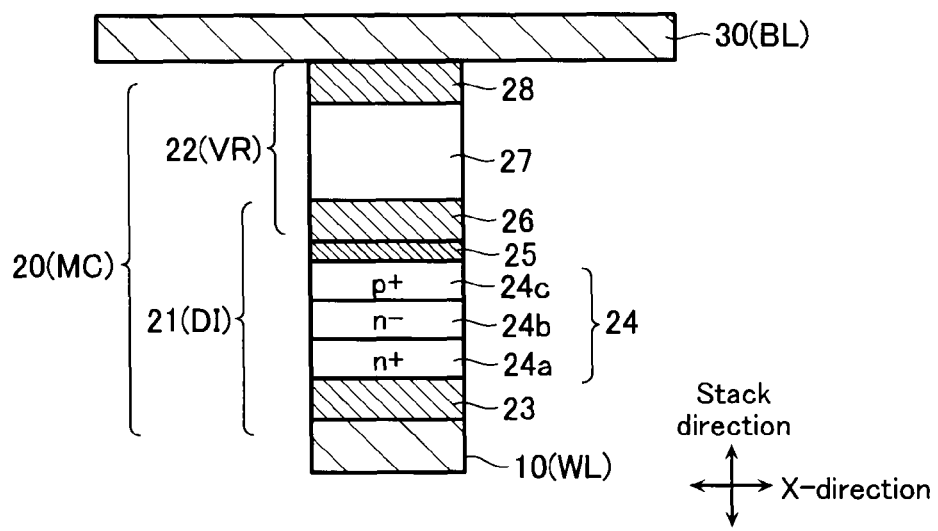
FIG. 4 is a cross-sectional view of a memory cell, taken along the line I-I' of FIG. 3 and seen from the direction of the arrows of FIG. 3.

Next, the stack structure of the memory layer 20 is described in detail. FIG. 4 is a cross-sectional view of a memory cell, taken along the line I-I' of FIG. 3 and seen from the direction of the arrows of FIG. 3.

As shown in FIG. 4, the memory layer 20 includes a rectifier element layer 21 that functions as the diode (the rectifier element) DI, and a variable resistive layer 22 that functions as the variable resistive element VR.

As shown in FIG. 4, the rectifier element layer 21 includes an electrode layer 23, a semiconductor layer 24, an electrode layer 25, and an electrode layer 26 that are stacked in this order on the first wiring layer 10. The electrode layer 23 and the electrode layer 26 each function as a barrier metal and an adhesion layer. The electrode layer 23 and the electrode layer 26 are made of titanium nitride (TiN), for example. The semiconductor layer 24 is made of polysilicon (poly-Si). As shown in FIG. 4, the semiconductor layer 24 includes an $n^+$-type semiconductor layer 24a, an $n^-$-type semiconductor layer 24b, and a $p^+$-type semiconductor layer 24c that are stacked in this order. The symbols "+" and "−" represent the level of the impurity density. The electrode layer 25 is made of titanium silicide ($TiSi_2$), for example.

As shown in FIG. 4, the variable resistive layer 22 includes the above-mentioned electrode layer 26. In other words, the variable resistive layer 22 and the rectifier element layer 21 share the electrode layer 26. The variable resistive layer 22 also includes a resistance change layer 27 and an electrode layer 28 that are stacked in this order on the electrode layer 26. The resistance change layer 27 is made of a material that can change its resistance value by virtue of current, heat, chemical energy, or the like, which is caused by voltage application. The electrode layer 28 functions as a barrier metal and an adhesion layer. The electrode layer 28 is made of titanium nitride (TiN).

[Operation of Memory Cells MC and Method of Controlling Memory Cells MC]

Next, the operation of each of the memory cells MC and the method of controlling the memory cells MC used in the nonvolatile semiconductor memory device of this embodiment are described.

The variable resistive elements VR, which have, for example, a structure of electrode/transition metal oxide (binary system or ternary system)/electrode, provide a change in resistance value of a metal oxide depending on the conditions of applied voltage, current, heat, etc., and store the different states of the resistance values as information in a non-volatile manner. More specifically, the following can be used as the variable resistive elements VR: changing resistance values with a phase transition between a crystalline state and an amorphous state, such as chalcogenide (PCRAM); changing resistance values by depositing metal cations to form a contacting bridge between electrodes, or ionizing the deposited metal to break down the contacting bridge (CBRAM: Conductive Bridging RAM); changing resistance values through application of voltage or current (ReRAM) (which is divided broadly into two types: one is the type where a resistance change occurs depending on the absence or presence of electric charges trapped by a charge trapping residing on the electrode interface; and the other is the type where a resistance change occurs depending on the absence or presence of a conductive path due to oxygen defect, etc.); and so on.

For unipolar type ReRAM, data write to a memory cell MC, that is, setting operation is performed by applying, for on the order of 10 ns to 100 ns, a voltage of, e.g., 1.5 V (in fact, on the order of 2.1 V if a voltage drop 0.6 V in the corresponding diode DI is included) and a current of on the order of 10 nA to a variable resistive element VR. As a result, the variable resistive element VR changes from a high-resistance state to a low-resistance state. As a factor of the above resistance change, there is considered, for example, a model in which when a high voltage is applied to the variable resistive element VR, internal cations (positive charge ions) move and a substance in an insulation state phase-changes to a series coupling state of electrochemically potentially (semi) stable conductive material. It is needless to say that there are considered other models because various models exist depending on substances.

On the other hand, data erase from a memory cell MC, that is, resetting operation is performed by applying, for on the order of 500 ns to 2 μs, a voltage of 0.6 V (in fact, on the order of 1.6 V if a voltage drop 1.0 V in the corresponding diode DI is included) and a current of on the order of 1 μA to 10 μA to a variable resistive element VR in its low-resistance state after the setting operation. As a result, the variable resistive element VR changes from a low-resistance state to a high-resistance state. As a factor of the above resistance change, there is considered a model, for example, in which atoms are thermally diffused by Joule heat generated in the variable resistive element VR and change to an original thermal equilibrium state.

Reading from the memory cell MC is performed by applying a voltage of 0.4 V (in fact, on the order of 1.2 V if a voltage drop 0.8 V in the corresponding diode DI is included) to the variable resistive element VR and monitoring the current flowing via the variable resistive element VR. In this manner, the variable resistive element VR is determined to be either in a low-resistance state or in a high-resistance state.

For example, a memory cell MC takes a high-resistance state as a stable state (reset state). Data is written to the memory cell MC by such a setting operation that causes a reset state to be switched to a low-resistance state and data is erased from the memory cell MC by such a resetting operation that causes a set state to be switched to a high-resistance state for binary storage.

Other than the above-mentioned reset state and the set state, the memory cell MC also has a state in which the variable resistive element VR is intentionally broken. The state in which the variable resistive element VR is broken is a state in which the electric resistance is lower than that in the set state. Once the variable resistive element VR is broken, a resetting operation cannot be performed to switch the memory cell MC from that state to a regular state (the reset state) with a high resistance value. As a result, the variable resistive element VR remains in a "permanent state" in which the electric resistance is low. To switch the variable resistive element VR to "permanent state", it is necessary to apply a higher voltage than that required for switching the memory cell MC to the "set state".

In short, the variable resistive element VR of the ReRAM may be in the "set state" (the first storage state) in which the resistance value is low, in the "reset state" (the second storage state) in which the resistance value is high, or in the "permanent state" (the third storage state) in which the variable resistive element VR is always in a low-resistance state, with the resetting operation and the setting operation being disabled.

Figure 5A:
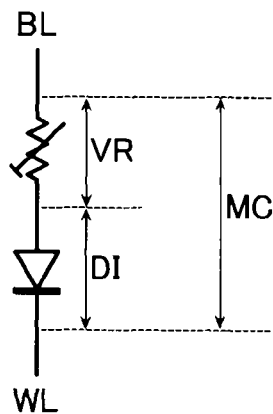
FIG. 5A is an equivalent circuit diagram of a memory cell MC of the first embodiment.
Figure 5B:
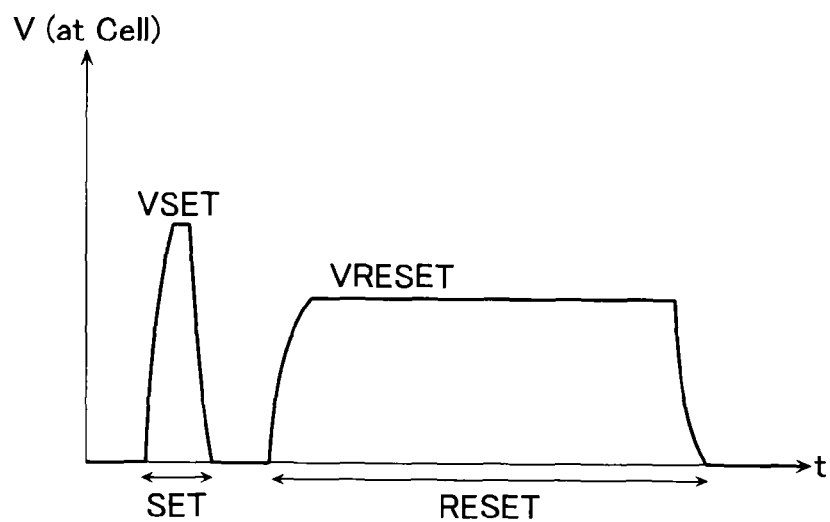
FIG. 5B is a voltage waveform chart illustrating a voltage applying operation performed to cause a state transition in the memory cell MC of the first embodiment.
Figure 5B:
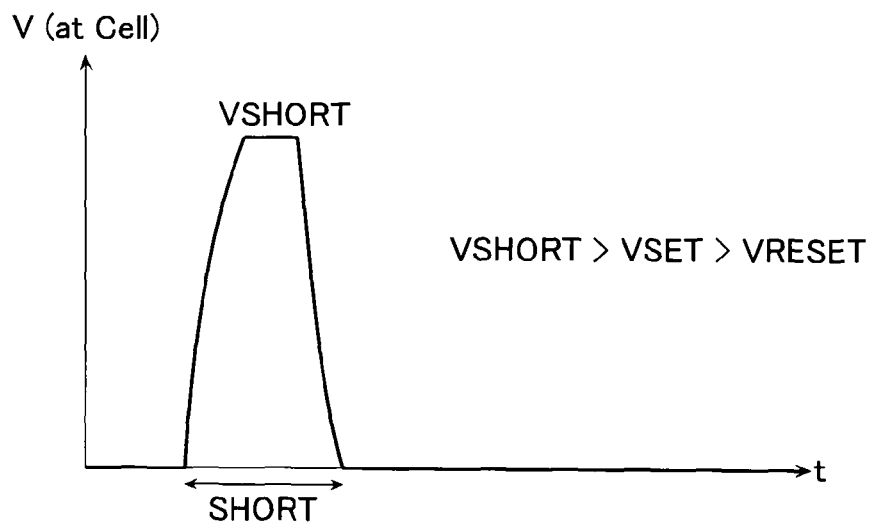

FIG. 5A is a circuit diagram of a memory cell MC. FIG. 5B is a voltage waveform chart illustrating an operation to apply a voltage for switching the memory cell MC to the set state, the reset state, and the permanent state.

The voltage to cause a transition to the "set state" is defined as VSET, the voltage to cause a transition to the "reset state" is defined as VRESET, and the voltage to cause a transition to the "permanent state" is defined as VSHORT. As shown in the voltage waveform chart of FIG. 5B, the relationship among the respective voltage values is expressed as VSHORT>VSET>VRESET. The relationship among the respective voltage application periods is expressed as VRESET>VSHORT>VSET.

The voltage for reading the state of the memory cell MC is defined as VREAD. The relationship among the voltage VREAD and the above three voltage values is expressed as VSHORT>VSET>VRESET>VREAD.

[Operation of Nonvolatile Semiconductor Memory Device According to First Embodiment]

Figure 6A:
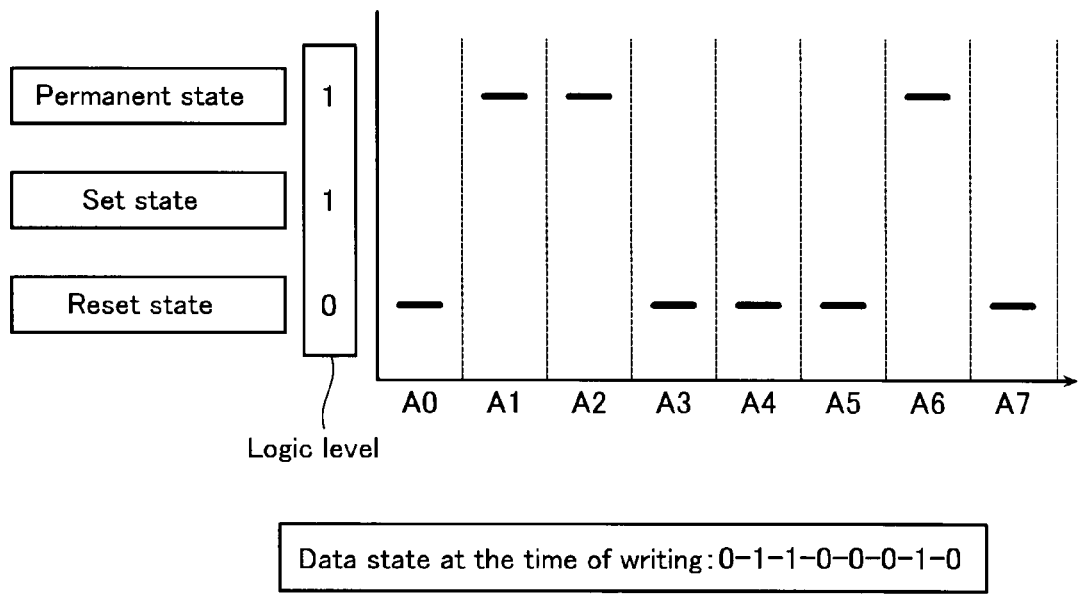
FIG. 6A shows the states and logic levels of memory cells at the time of writing in the nonvolatile semiconductor memory device according to the first embodiment.
Figure 6B:
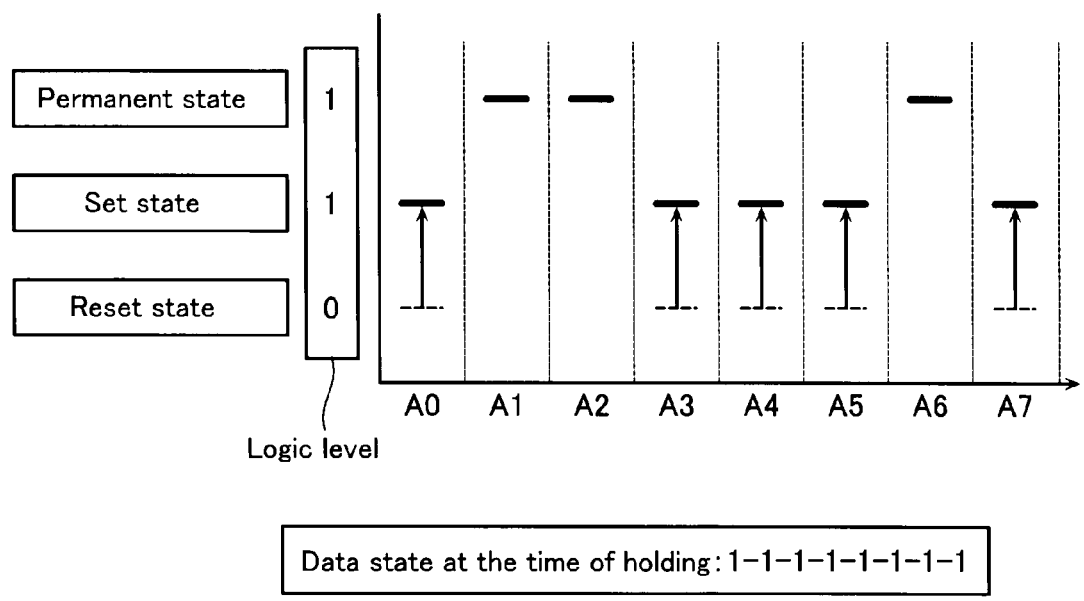
FIG. 6B shows the states and logic levels of memory cells at the time of data holding in the nonvolatile semiconductor memory device according to the first embodiment.
Figure 6C:
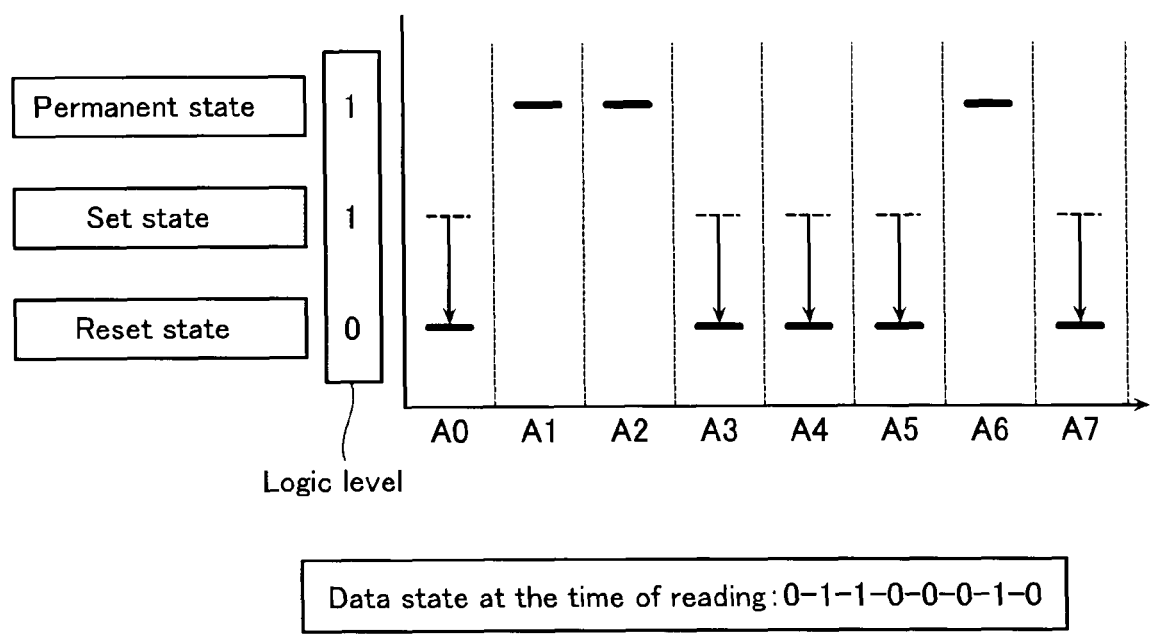
FIG. 6C shows the states and logic levels of memory cells at the time of reading in the nonvolatile semiconductor memory device according to the first embodiment.

Referring now to FIGS. 6A to 6C, the operation of the nonvolatile semiconductor memory device according to this embodiment is described. FIGS. 6A to 6C are diagrams illustrating the states and logic levels of a memory cell observed when writing, data holding, and reading are performed in the nonvolatile semiconductor memory device according to this embodiment. In the following explanation, the "reset state" in which the variable resistive element VR is in a high-resistance state and current does not easily flow is set at the logic level "0", and the "set state" in which the variable resistive element VR is in a low-resistance state and current easily flows is set at the logic level "1". The "permanent state" in which the variable resistive element VR is constantly in a low-resistance state is also set at the logic level "1", which is the same as the logic level of the "set state".

In the memory cell array 1, there exist the regular data region 1a and the confidential data region 1b, as described above. In the nonvolatile semiconductor memory device according to this embodiment, the confidential data to be stored in the confidential data region 1b is stored with the use of memory cells MC that can have transitions between the "reset state" and the "set state", and memory cells MC in the "permanent state". Here, 8-bit information "0"-"1"-"1"-"0"-"0"-"0"-"1"-"0" is to be stored as confidential data information into eight memory cells MC corresponding to address signals A0 to A7.

FIG. 6A illustrates an example where the 8-bit confidential data information "0"-"1"-"1"-"0"-"0"-"0"-"1"-"0" is written into the memory cells MC corresponding to the address signals A0 to A7.

In the case of the nonvolatile semiconductor memory device of this embodiment, the logic level "1" data of the confidential data information is assigned to the memory cells MC in the "permanent state". The logic level "0" data of the confidential data information is assigned to the memory cells MC that can have transitions between the "reset state" and the "set state". In this manner, the confidential data information is stored. More specifically, the voltage VSHORT is applied to the memory cells MC (corresponding to the address signals A1, A2, and A6) into which the logic level "1" data is to be written. The voltage VRESET is applied to the memory cells MC (corresponding to the address signals A0, A3, A4, A5, and A7) into which the logic level "0" data is to be written. In this manner, the confidential data information of this embodiment is written into the memory cells MC in the "permanent state" and the memory cells MC in the "reset state".

The circuits of this embodiment do not include a circuit for protecting the confidential data information, such as a special command control circuit. Therefore, with the written confidential data information being simply held, the row decoder 3 and the column decoder 4 are activated when an address is input from outside, and the confidential data information is read. To solve this problem, the nonvolatile semiconductor memory device according to this embodiment holds the confidential data information in the following manner.

FIG. 6B illustrates an example where the 8-bit confidential data information "0"-"1"-"1"-"0"-"0"-"0"-"1"-"0" is held in the memory cells MC corresponding to the address signals A0 to A7.

In the nonvolatile semiconductor memory device according to this embodiment, the memory cells MC storing the logic level "0" data is switched to the "set state" to store the logic level "1" data at the time of data holding. More specifically, a setting operation is performed to switch the memory cells MC corresponding to the address signals A0, A3, A4, A5, and A7 to the logic level "1" data, as shown in FIG. 6B. In this case, the setting operation is simply performed on all the memory cells MC that store the confidential data information and correspond to the address signals A0 to A7, or on the entire confidential data region. This is because, even if the setting operation is performed on the memory cells MC that are in the "permanent state" and correspond to the address signals A1, A2, and A6, the states of those memory cells MC do not change from the state of the logic level "1" data, which is a low-resistance state.

In a case where an address is input from the outside and the confidential data information is read in this situation, the states of all the memory cells MC in the confidential data region are the logic level "1" data, when seen from outside. Therefore, the read data is not the 8-bit data of the original confidential data information "0"-"1"-"1"-"0"-"0"-"0"-"1"-"0", but is the 8-bit data "1"-"1"-"1"-"1"-"1"-"1"-"1"-"1". In this manner, the confidential data information can be protected from the outside.

Next, an operation to be performed to read the confidential data information in the nonvolatile semiconductor memory device according to this embodiment is described. FIG. 6C illustrates an example where the 8-bit confidential data information "0"-"1"-"1"-"0"-"0"-"0"-"1"-"0" is read from the memory cells MC corresponding to the address signals A0 to A7.

After performing a resetting operation on all the memory cells MC corresponding to the address signals A0 to A7, the nonvolatile semiconductor memory device according to this embodiment performs a data reading operation. More specifically, as shown in FIG. 6C, the resetting operation is performed to switch the memory cells MC corresponding to the address signals A0, A3, A4, A5, and A7 to the logic level "0" data. In this case, the resetting operation is simply performed on all the memory cells MC that store the confidential data information and correspond to the address signals A0 to A7, or on the entire confidential data region. This is because, even if the resetting operation is performed on all the memory cells MC corresponding to the address signals A0 to A7, the states of the memory cells MC in the "permanent state" do not change from the state of the logic level "1" data, which is a low-resistance state. On the other hand, only the memory cells MC corresponding to the address signals A0, A3, A4, A5, and A7 are reset so as to have the logic level "0" data. Through the resetting operation, the states of the memory cells MC become the 8-bit data "0"-"1"-"1"-"0"-"0"-"0"-"1"-"0", which is the original confidential data information, and accordingly, the confidential data information can be correctly read. After the confidential data information is read, the setting operation is again performed on all the memory cells MC corresponding to the address signals A0 to A7, to protect the data.

[Effects of Nonvolatile Semiconductor Memory Device According to First Embodiment]

As described above, in the nonvolatile semiconductor memory device according to this embodiment, the logic level "1" data is assigned to the memory cells MC in the "permanent state", and the logic level "0" data is assigned to the memory cells MC that can have transitions between the "reset state" and the "set state". In this manner, the confidential data information is stored. At the time of data holding, all the memory cells MC are switched to the logic level "1" data by a setting operation. In a reading operation, a resetting operation is performed to read the data. To read the confidential data information, a resetting operation needs to be performed on all the memory cells MC, with the location of the confidential data information being identified. When data is to be illegally read from the memory cell array 1, a correct decision cannot be made as to whether to perform a resetting operation on the memory cells MC prior to the reading, or to read the held data as it is, unless the confidential data region 1b is identified. In this manner, the nonvolatile semiconductor memory device according to this embodiment can protect the confidential data information from the outside, and does not require a circuit such as a special command control circuit that is conventionally required. Accordingly, an increase in chip size can be prevented.

[First Modification of Nonvolatile Semiconductor Memory Device According to First Embodiment]

Figure 7:
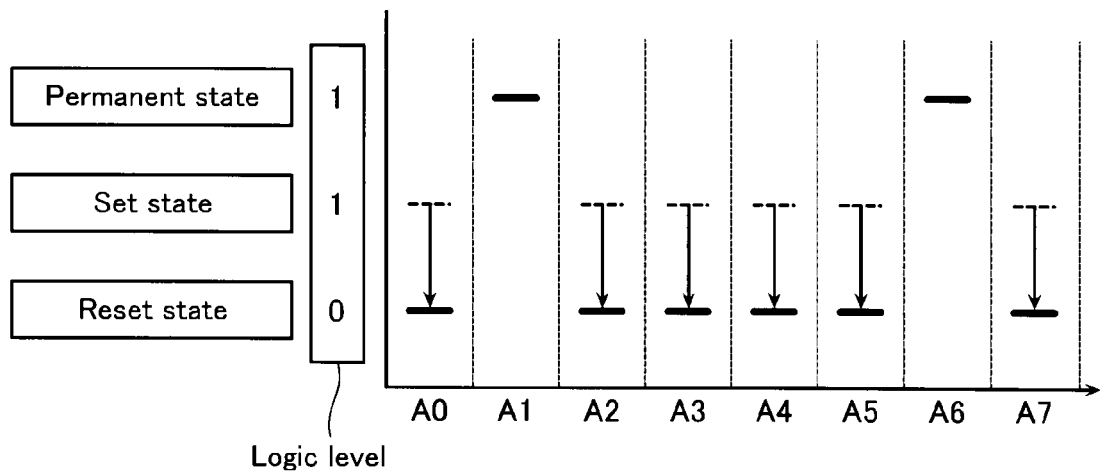
FIG. 7 illustrates the structure and the states of memory cells of a first modification of the nonvolatile semiconductor memory device according to the first embodiment.
Figure 7:
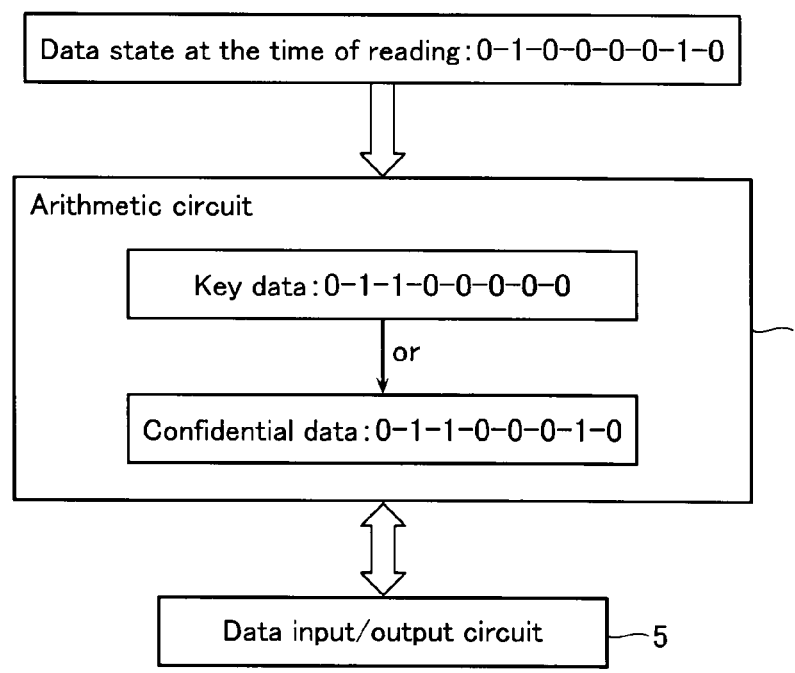

FIG. 7 illustrates the structure and the states of the memory cells of a first modification of the nonvolatile semiconductor memory device according to the first embodiment. The nonvolatile semiconductor memory device of this modification differs from that of the first embodiment in that an arithmetic circuit C is connected to the data input/output circuit 5. The arithmetic circuit C performs a predetermined calculation between data that is read from the memory cell array 1 and key data that is stored beforehand, and outputs the calculation result to the data input/output circuit 5. The other features of this structure are the same as those of the first embodiment above-described, and therefore, explanation thereof is omitted herein. In this modification, the confidential data information is also the 8-bit information "0"-"1"-"1"-"0"-"0"-"0"-"1"-"0".

In the memory cell array 1, 8-bit data "0"-"1"-"0"-"0"-"0"-"0"-"1"-"0", which differs from the confidential data information, is written in the memory cells MC corresponding to the address signals A0 to A7. Here, the logic level "1" data of the data to be written is assigned to the memory cells MC in the permanent state, and the logic level "0" data of the confidential data information is assigned to the memory cells MC that can have transitions between the "reset state" and the "set state". In this manner, write data is stored.

In this modification, a setting operation is also performed so that all the memory cells MC have the logic level "1" data at the time of data holding. At the time of data reading, data is read after a resetting operation is performed on all the memory cells MC.

The data "0"-"1"-"0"-"0"-"0"-"0"-"1"-"0", which is read from the memory cells MC corresponding to the address signals A0 to A7, is input to the arithmetic circuit C via the bit line control circuit 2. The logical sum of the data that is read from the memory cell array 1 and the key data "0"-"1"-"1"-"0"-"0"-"0"-"0"-"0" is calculated by the arithmetic circuit C. The logical sum data "0"-"1"-"1"-"0"-"0"-"0"-"1"-"0" is then output as the confidential data information from the data input/output circuit 5 to the outside.

In this modification, the data "0"-"1"-"0"-"0"-"0"-"0"-"1"-"0", which is written in the memory cells MC corresponding to the address signals A0 to A7, differs from the original confidential data information. Even if data is read after a resetting operation is performed on the memory cells MC corresponding to the address signals A0 to A7 identifying the confidential data region 1b, the data still differs from the confidential data information. Accordingly, the nonvolatile semiconductor memory device of this modification can further improve the protection performance for the confidential data information.

[Second Modification of Nonvolatile Semiconductor Memory Device According to First Embodiment]

Figure 8:
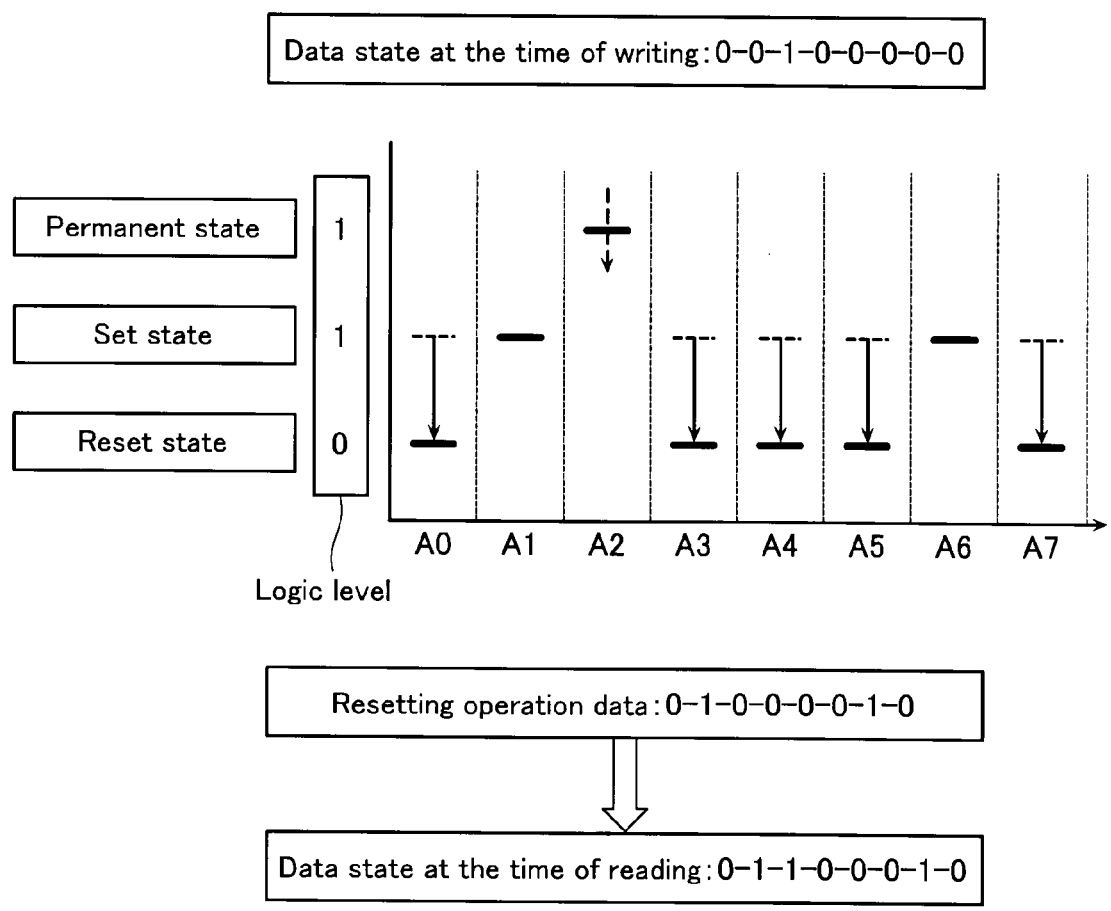
FIG. 8 illustrates the states of memory cells at the time of reading in a second modification of the nonvolatile semiconductor memory device according to the first embodiment.

FIG. 8 illustrates the states of the memory cells of a second modification of the nonvolatile semiconductor memory device according to the first embodiment. The nonvolatile semiconductor memory device of this modification differs from that of the first embodiment in that, at the time of data reading, a resetting operation is performed on predetermined memory cells MC based on predetermined data. The other features of this structure are the same as those of the first embodiment above-described, and therefore, explanation thereof is omitted herein. In this modification, the confidential data information is also the 8-bit information "0"-"1"-"1"-"0"-"0"-"0"-"1"-"0".

In the memory cell array 1, 8-bit data "0"-"0"-"1"-"0"-"0"-"0"-"0"-"0", which differs from the confidential data information, is written in the memory cells MC corresponding to the address signals A0 to A7. Here, the logic level "1" data of the data to be written is assigned to the memory cells MC in the permanent state, and the logic level "0" data of the confidential data information is assigned to the memory cells MC that can have transitions between the "reset state" and the "set state". In this manner, the confidential data information is stored. In this modification, a setting operation is also performed so that all the memory cells MC have the logic level "1" data at the time of data holding.

At the time of data reading in this modification, a resetting operation is performed on the predetermined memory cells MC, based on the predetermined resetting operation data. The data is then read. More specifically, the nonvolatile semiconductor memory device performs a resetting operation on the memory cells MC (corresponding to the address signals A0, A2, A3, A4, A5, and A7) of the resetting operation data "0", based on the resetting operation data "0"-"1"-"0"-"0"-"0"-"0"-"1"-"0", which is input from an external host via the data input/output circuit 5. Meanwhile, a resetting operation is not performed on the memory cells MC (corresponding to the address signals A1 and A6) of the resetting operation data "1".

The data "0"-"1"-"1"-"0"-"0"-"0"-"1"-"0", which is read from the memory cells MC corresponding to the address signals A0 to A7 by this reading operation, is then output as the confidential data information from the data input/output circuit 5 to the outside.

The write data and the reading operation using the resetting operation data of this modification achieve the same effects as the logical sum of the read data and the key data of the first modification. In this modification, the data "0"-"0"-"1"-"0"-"0"-"0"-"0"-"0", which is written in the memory cells MC corresponding to the address signals A0 to A7, differs from the original confidential data information. Even if data is read after a resetting operation is performed on the memory cells MC corresponding to the address signals A0 to A7 identifying the confidential data region 1b, the data still differs from the confidential data information. Accordingly, the nonvolatile semiconductor memory device of this modification can further improve the protection performance for the confidential data information.

[Third Modification of Nonvolatile Semiconductor Memory Device According to First Embodiment]

Figure 9:
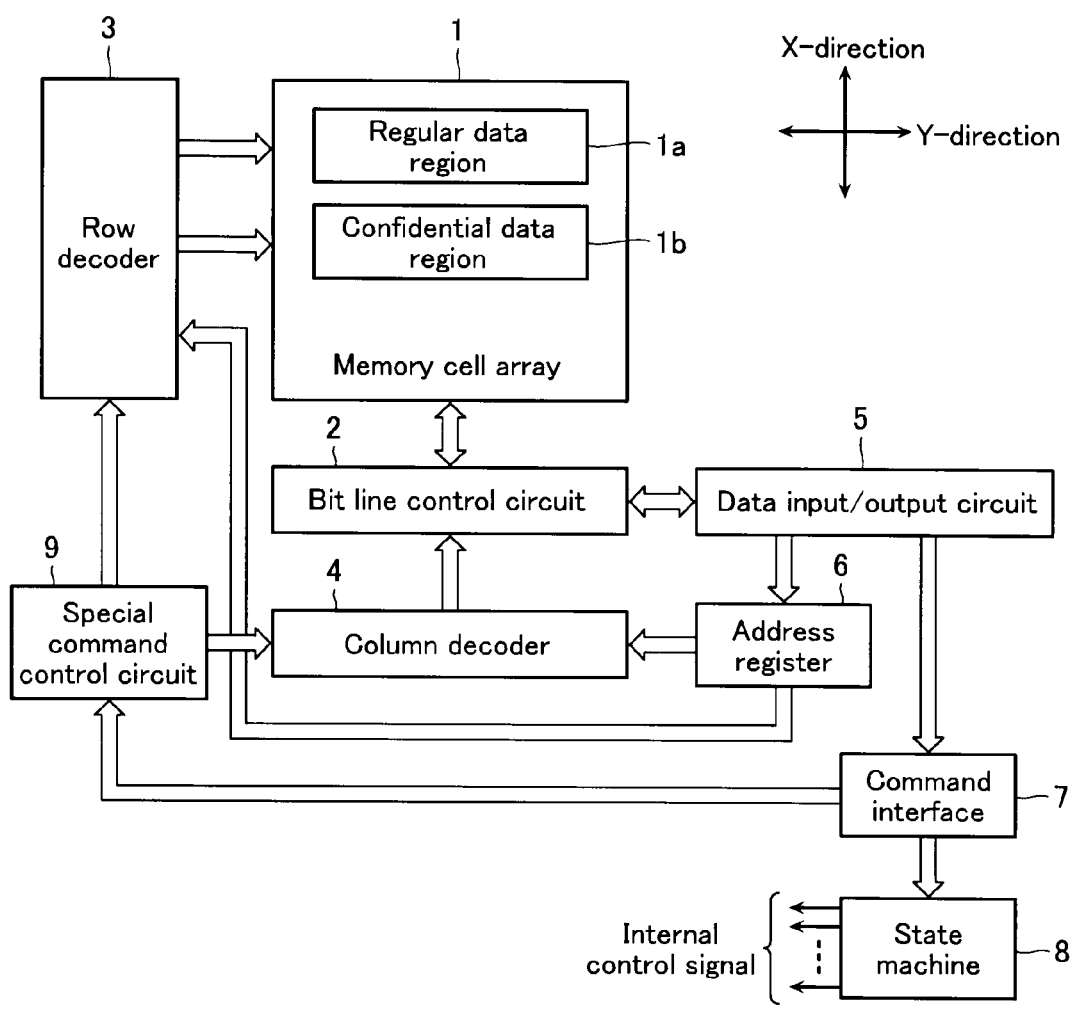
FIG. 9 is a block diagram showing the structure of a third modification of the nonvolatile semiconductor memory device according to the first embodiment.

FIG. 9 is a block diagram showing the structure of a third modification of the nonvolatile semiconductor memory device according to the first embodiment. The nonvolatile semiconductor memory device of this modification differs from that of the first embodiment in that a special command control circuit 9 is connected to the row decoder 3 and the column decoder 4. The special command control circuit 9 activates the row decoder 3 and the column decoder 4 to enable a reading operation, only when a special command that is not known to any third party is input. The other features of this structure are the same as those of the first embodiment, and therefore, explanation thereof is omitted herein. In this modification, the confidential data information is also the 8-bit information "0"-"1"-"1"-"0"-"0"-"0"-"1"-"0".

In this modification, the logic level "1" data of the confidential data information is assigned to the memory cells MC in the permanent state, and the logic level "0" data of the confidential data information is assigned to the memory cells MC that can have transitions between the "reset state" and the "set state" as in the first embodiment. In this manner, the confidential data information is stored. In this modification, a setting operation is also performed so that all the memory cells MC have the logic level "1" data at the time of data holding.

At the time of data reading in the nonvolatile semiconductor memory device of this modification, a special command is input to the special command control circuit 9. The row decoder 3 and the column decoder 4 are activated by this special command. After that, a resetting operation is performed on all the memory cells MC in the confidential data region 1b, and the confidential data information is read.

Since the method of writing, holding, and reading the confidential data information in this modification is the same as that in the first embodiment, the confidential data information can be protected from the outside. As the special command control circuit 9 is provided in this modification, the chip area is increased by the corresponding amount. However, the nonvolatile semiconductor memory device of this modification can further improve the protection performance for the confidential data information.

SECOND EMBODIMENT

[Structure of Nonvolatile Semiconductor Memory Device According to Second Embodiment]

Next, a nonvolatile semiconductor memory device according to a second embodiment of the present invention is described. The nonvolatile semiconductor memory device according to this embodiment differs from that according to the first embodiment in being a NAND-type EEPROM including memory cells MC that each change the threshold voltage by injecting and releasing electrons into a floating gate.

Figure 10:
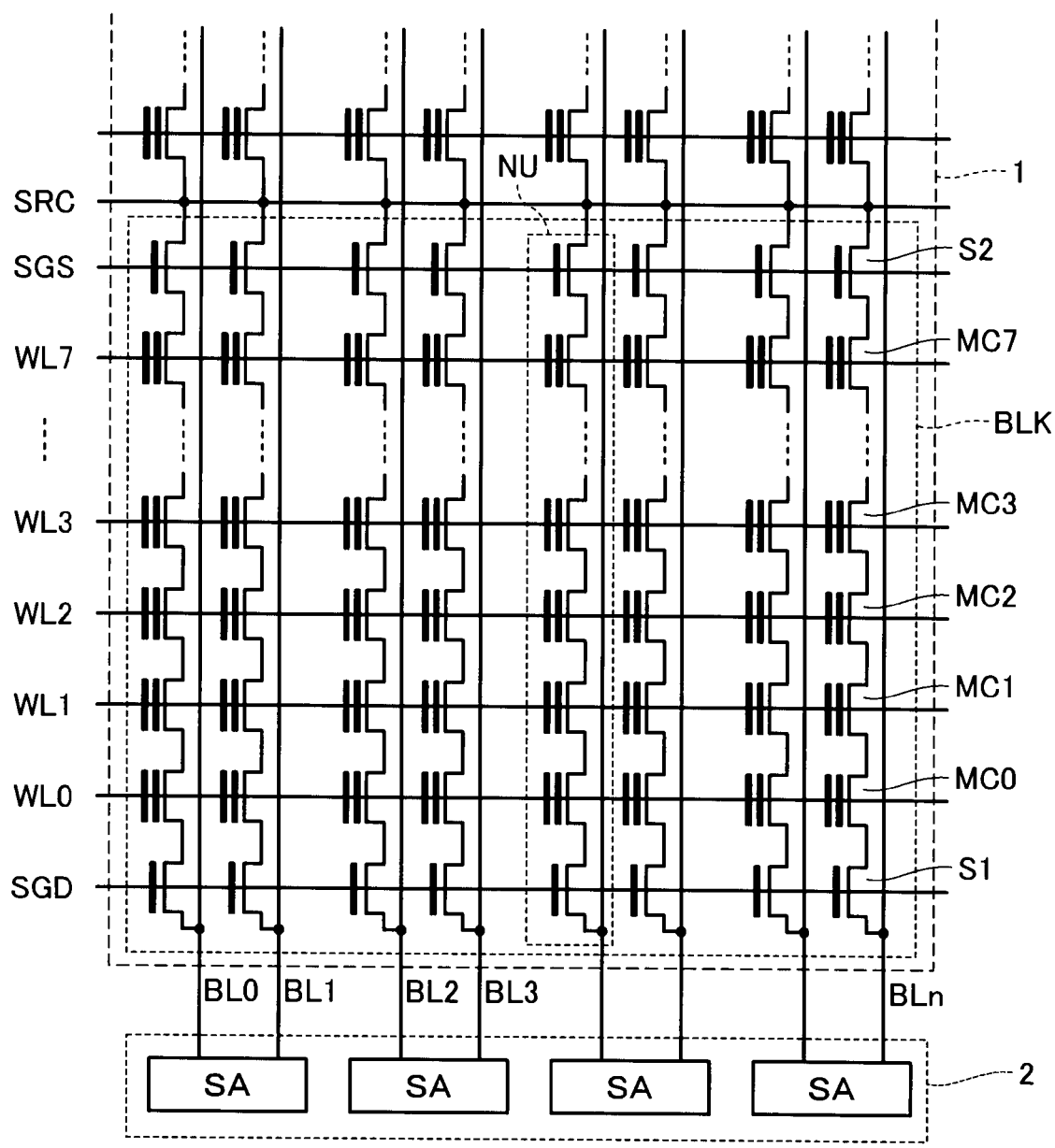
FIG. 10 is a circuit diagram of a memory cell array 1 and peripheral circuits of a nonvolatile semiconductor memory device according to a second embodiment.

FIG. 10 is a circuit diagram of a memory cell array 1 and its peripheral circuits. The memory cell array 1 of the nonvolatile semiconductor memory device of this embodiment is formed by arranging nonvolatile memory cells MC in a matrix fashion, as shown in FIG. 10. The nonvolatile memory cells MC can be electrically rewritten. Each of the memory cells MC includes an n-type source/drain diffusion layer formed on p-well of a silicon substrate, and is a stack gate structure including a floating gate as a charge storage layer and a control gate. The NAND-type EEPROM changes the amount of charges held in the floating gate, to perform a writing operation and an erasing operation. By varying the threshold voltage of a subject memory cell MC, 1-bit or multibit data is stored. In this example, eight memory cells MC0 to MC7 are connected in series, and select gate transistors S1 and S2 are connected to both ends of the set of memory cells, to form a NANA cell unit (a NAND string) NU.

One end of each NAND cell unit NU is connected to a bit line BL0, BL1, . . . , or BLn via the select gate transistor S1, and the other end is connected to a common source line SRC via the select gate transistor S2. The control gates of the memory cells MC0 to MC7 are connected to word lines WL0 to WL7, respectively, and the gates of the select gate transistors S1 and S2 are connected to select gate lines SGD and SGS.

Each set of NAND cell units NU arranged in the word line direction forms a block BLK that is the minimum unit for data erasing, and more than one block BLK is arranged in the bit line direction. Each set of memory cells MC arranged in the word line direction forms a page that is a unit for writing and reading.

The bit lines BL of each block BLK are connected to sense amplifiers SA in the bit line control circuit 2. The sense amplifiers SA control writing operations and reading operations. Here, the memory cells that are commonly connected to one word line WL and are selected through the bit lines BL form one page that is a unit for simultaneous writing or reading. Each word line WL is connected to a row decoder 3 that is not shown in FIG. 10, and a predetermined voltage required for performing data writing or reading on the memory cells MC is applied to each word line WL.

[Operation of Nonvolatile Semiconductor Memory Device According to Second Embodiment]

Figure 11A:
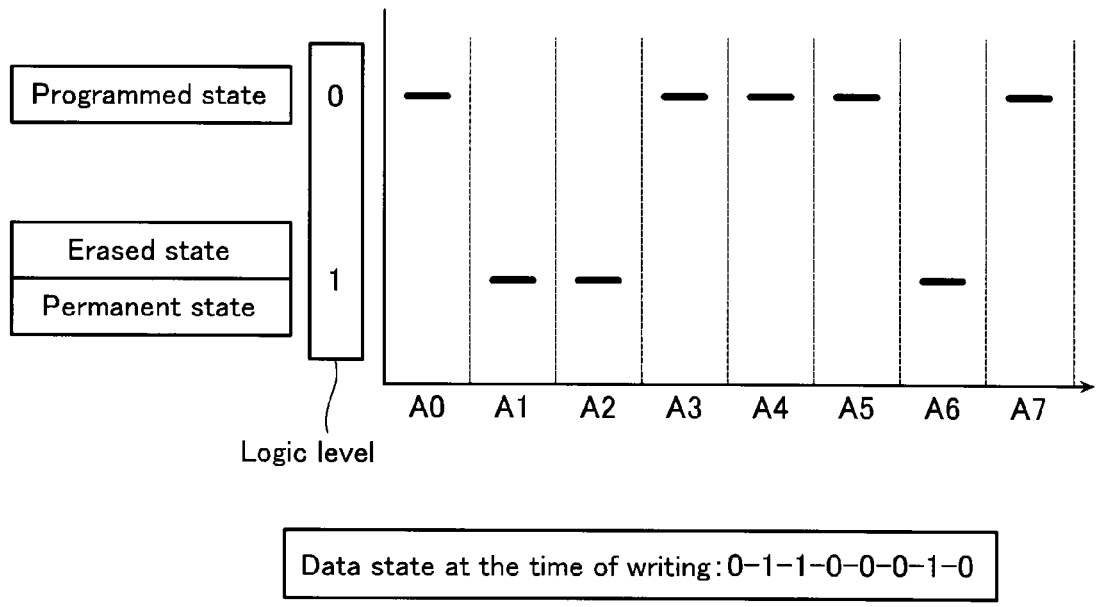
FIG. 11A shows the states and logic levels of the memory cells at the time of writing in the nonvolatile semiconductor memory device according to the second embodiment.
Figure 11B:
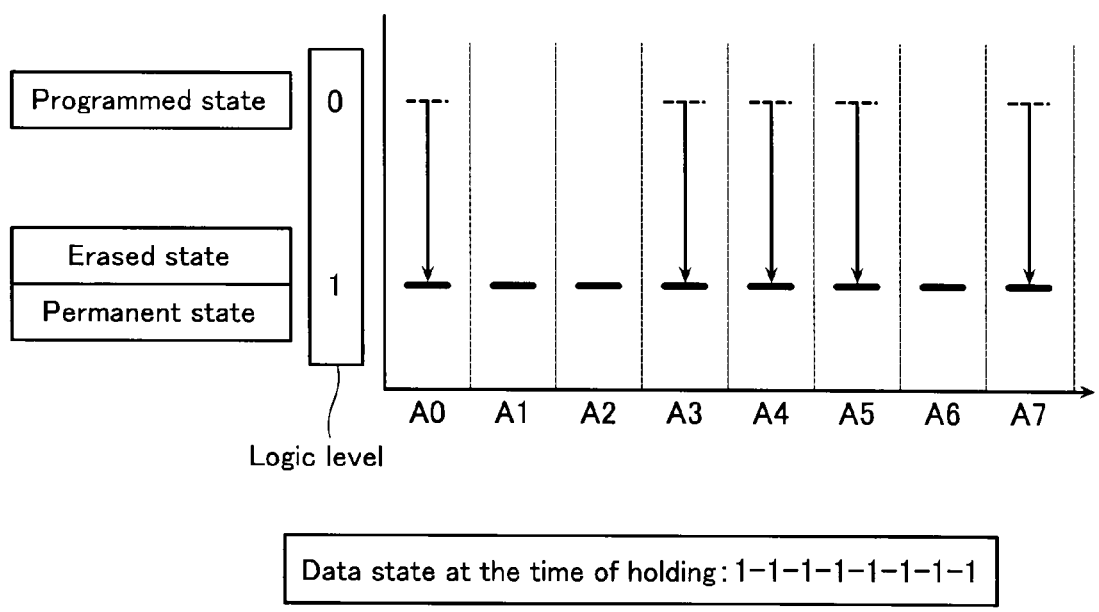
FIG. 11B shows the states and logic levels of the memory cells at the time of data holding in the nonvolatile semiconductor memory device according to the second embodiment.
Figure 11C:
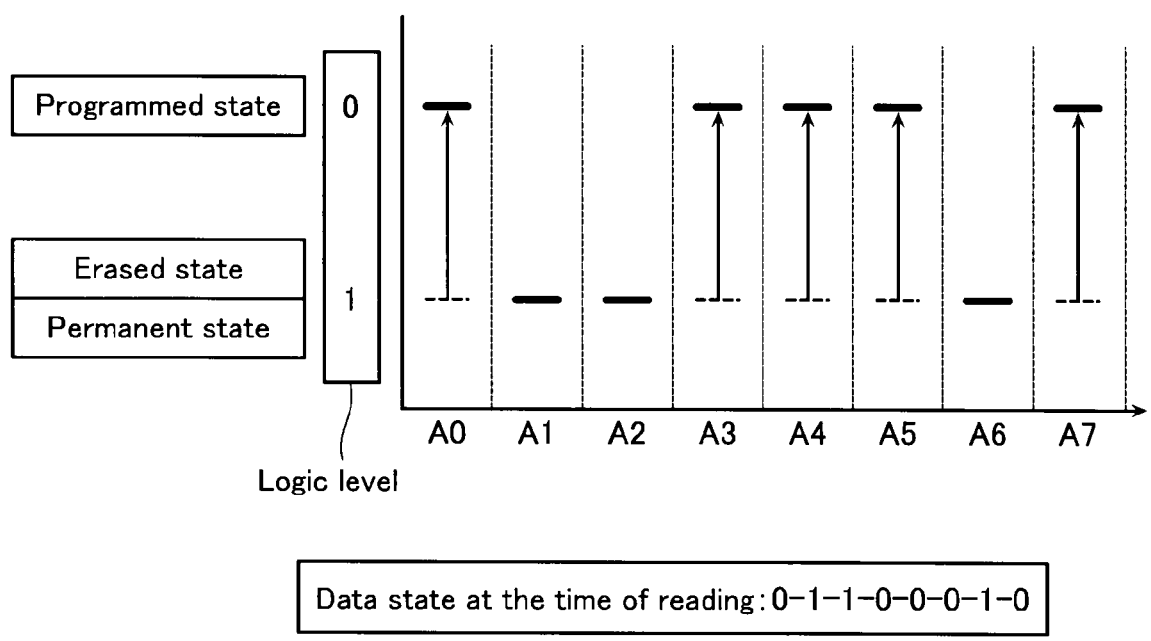
FIG. 11C shows the states and logic levels of the memory cells at the time of reading in the nonvolatile semiconductor memory device according to the second embodiment.

Referring now to FIGS. 11A to 11C, the operation of the nonvolatile semiconductor memory device according to this embodiment is described. FIGS. 11A to 11C illustrate the states and logic levels of the memory cells when writing, data holding, and reading are performed in the nonvolatile semiconductor memory device according to this embodiment. In the following description, a state in which all the electrons are released from the floating gate of a memory cell MC and the threshold voltage is low will be referred to as an "erased state", and a state in which electrons are injected into the floating gate and the threshold voltage is high will be referred to as a "programmed state". The "erased state" is at the logic level "1", and the "programmed state" is at the logic level "0". In the case where the nonvolatile semiconductor memory device is a NAND-type EEPROM, a state in which electrons cannot be injected into the floating gate at all is a permanent state, and this state is at the logic level "1".

In the memory cell array 1, there exist the regular data region 1a and the confidential data region 1b, as described above. In the nonvolatile semiconductor memory device according to this embodiment, the confidential data to be stored in the confidential data region 1b is stored with the use of memory cells MC that can have transitions between the "erased state" and the "programmed state", and memory cells MC in the "permanent state". Here, 8-bit information "0"-"1"-"1"-"0"-"0"-"0"-"1"-"0" is to be stored as confidential data information into eight memory cells MC corresponding to address signals A0 to A7.

FIG. 11A illustrates an example where the 8-bit confidential data information "0"-"1"-"1"-"0"-"0"-"0"-"1"-"0" is written into the memory cells MC corresponding to the address signals A0 to A7.

In the case of the nonvolatile semiconductor memory device of this embodiment, the logic level "1" data of the confidential data information is assigned to the memory cells MC in the "permanent state". The logic level "0" data of the confidential data information is assigned to the memory cells MC that can have transitions between the "erased state" and the "programmed state". In this manner, the confidential data information is stored. More specifically, electrons are not injected into the floating gates of the memory cells MC (corresponding to the address signals A1, A2, and A6) in which the logic level "1" data is written. Meanwhile, electrons are injected into the floating gates of the memory cells MC (corresponding to the address signals A0, A3, A4, A5, and A7) in which the logic level "0" data is written. In this manner, the confidential data information of this embodiment is written into the memory cells MC in the "permanent state" and the memory cells MC in the "programmed state".

Next, an operation to be performed to hold the confidential data information in the nonvolatile semiconductor memory device according to this embodiment is described. FIG. 11B illustrates an example where the 8-bit confidential data information "0"-"1"-"1"-"0"-"0"-"0"-"1"-"0" is held in the memory cells MC corresponding to the address signals A0 to A7.

In the nonvolatile semiconductor memory device according to this embodiment, the memory cells MC storing the logic level "0" data is switched to the "erased state" to store the logic level "1" data at the time of data holding. More specifically, an erasing operation to release electrons from the floating gates is performed to switch the memory cells MC corresponding to the address signals A0, A3, A4, A5, and A7 to the logic level "1" data, as shown in FIG. 11B. In this case, the erasing operation is simply performed on all the memory cells MC that store the confidential data information and correspond to the address signals A0 to A7, or on the entire confidential data region. This is because, even if the erasing operation is performed on the memory cells MC that are in the "permanent state" and correspond to the address signals A1, A2, and A6, the states of those memory cells MC do not change from the state of the logic level "1" data.

In a case where an address is input from the outside and the confidential data information is read in this situation, the states of all the memory cells MC in the confidential data region are the logic level "1" data, when seen from outside. Therefore, the read data is not the 8-bit data of the original confidential data information "0"-"1"-"1"-"0"-"0"-"0"-"1"-"0", but is the 8-bit data "1"-"1"-"1"-"1"-"1"-"1"-"1"-"1". In this manner, the confidential data information can be protected from the outside.

Next, an operation to be performed to read the confidential data information in the nonvolatile semiconductor memory device according to this embodiment is described. FIG. 11C illustrates an example where the 8-bit confidential data information "0"-"1"-"1"-"0"-"0"-"0"-"1"-"0" is read from the memory cells MC corresponding to the address signals A0 to A7.

After performing a programming operation on all the memory cells MC corresponding to the address signals A0 to A7, the nonvolatile semiconductor memory device according to this embodiment performs a data reading operation. More specifically, as shown in FIG. 11C, the programming operation to inject electrons into the floating gates is performed to switch the memory cells MC corresponding to the address signals A0, A3, A4, A5, and A7 to the logic level "0" data. In this case, the programming operation is simply performed on all the memory cells MC that store the confidential data information and correspond to the address signals A0 to A7, or on the entire confidential data region. This is because, even if the programming operation is performed on all the memory cells MC corresponding to the address signals A0 to A7, electrons are not injected into the floating gates of the memory cells MC in the "permanent state", and the states of the memory cells MC in the "permanent state" do not change from the state of the logic level "1" data. On the other hand, only the memory cells MC corresponding to the address signals A0, A3, A4, A5, and A7 are programmed so as to have the logic level "0" data. Through the programming operation, the states of the memory cells MC become the 8-bit data "0"-"1"-"1"-"0"-"0"-"0"-"1"-"0", which is the original confidential data information, and accordingly, the confidential data information can be correctly read. After the confidential data information is read, the erasing operation is again performed on all the memory cells MC corresponding to the address signals A0 to A7, to protect the data.

[Effects of Nonvolatile Semiconductor Memory Device According to Second Embodiment]

As described above, in the nonvolatile semiconductor memory device according to this embodiment, the logic level "1" data is assigned to the memory cells MC in the "permanent state", and the logic level "0" data is assigned to the memory cells MC that can have transitions between the "programmed state" and the "erased state". In this manner, the confidential data information is stored. At the time of data holding, all the memory cells MC are switched to the logic level "1" data by an erasing operation. In a reading operation, a programming operation is performed to read the data. To read the confidential data information, a programming operation needs to be performed on all the memory cells MC, with the location of the confidential data information being identified. When data is to be illegally read from the memory cell array 1, a correct decision cannot be made as to whether to perform a programming operation on the memory cells MC prior to the reading, or to read the held data as it is, unless the confidential data region 1b is identified. In this manner, the nonvolatile semiconductor memory device according to this embodiment can protect the confidential data information from the outside, and does not require a circuit such as a special command control circuit that is conventionally required. Accordingly, an increase in chip size can be prevented.

Although the present invention has been described by way of the embodiments, the present invention is not limited to those embodiments, and various changes, additions, and combinations are possible without departing from the scope of the invention. For example, the present invention is not limited to the above-described ReRAM or NAND-type EEPROM, but may be applied to any device (such as a PCRAM, a MRAM: Magnetoresistive Random Access Memory, or a CNT memory: Carbon Nanotube Memory) that stores data with the use of memory cells having only one type of logic level data in a permanent state in which data writing and erasing cannot be electrically performed, and memory cells having at least two types of data storage states. Further, the structures described as the first to third modifications of the first embodiment may of course be also applied to the nonvolatile semiconductor memory device according to the second embodiment.

What is claimed is:

1. A nonvolatile semiconductor memory device comprising:
    a memory cell array including regular memory cells that are capable of switching between a first data storage state and a second data storage state by electric rewriting, and permanent memory cells that are not to be electrically rewritten and are fixed in a third data storage state that is read as the same logic level data as the first storage state; and
    a control circuit configured to control data rewriting into the memory cell array, data holding in the memory cell array, and data reading from the memory cell array, data to be written into the memory cell array being stored in at least one of the regular memory cells and at least one of the permanent memory cells in the memory cell array, the control circuit operative to rewrite at least one of the regular memory cells from the second data storage state to the first data storage state at the time of data holding, the control circuit operative to perform a reading operation after rewriting the regular memory cells from the first data storage state to the second data storage state at the time of data reading.

2. The nonvolatile semiconductor memory device according to claim 1, wherein
    the data to be written into the memory cell array is written into a predetermined confidential data region of the memory cell array,
    at the time of data holding, the control circuit rewrites all the regular memory cells in the confidential data region to the first data storage state, and
    at the time of data reading, the control circuit performs a reading operation after rewriting all the rewritten regular memory cells from the first data storage state to the second data storage state.

3. The nonvolatile semiconductor memory device according to claim 2, wherein
    at the time of data holding, the control circuit performs an operation to rewrite all the regular memory cells and the permanent memory cells in the confidential data region to the first data storage state, and
    at the time of data reading, the control circuit performs a reading operation after performing an operation to rewrite all the regular memory cells and the permanent memory cells in the confidential data region to the second data storage state.

4. The nonvolatile semiconductor memory device according to claim 1, wherein
    the control circuit further includes an arithmetic circuit that performs a calculating operation on data read from the memory cell array at the time of data reading and key data, and outputs a result of the calculating operation.

5. The nonvolatile semiconductor memory device according to claim 1, wherein
    when rewriting at least one of the regular memory cells from the first data storage state to the second data storage state at the time of data reading, the control circuit selects the at least one of the regular memory cells based on predetermined operation data, the at least one of the regular memory cells being rewritten to the second data storage state.

6. The nonvolatile semiconductor memory device according to claim 1, wherein
    the control circuit further includes a special command control circuit that enables an operation to read data from the memory cell array only when a special command is input.

7. A nonvolatile semiconductor memory device comprising:
    a memory cell array including a plurality of first wirings, a plurality of second wirings that intersect with the first wirings, and memory cells that are placed at intersecting portions between the first wirings and the second wirings, each of the memory cells having a series circuit of a non-ohmic element and a variable resistive element; and
    a control circuit configured to control data rewriting into the memory cell array, data holding in the memory cell array, and data reading from the memory cell array, by applying a predetermined voltage to the memory cells selected through selected ones of the first wirings and selected ones of the second wirings, the memory cells being regular memory cells that are capable of switching between a first data storage state and a second data storage state when the predetermined voltage is applied and a resistance value of the variable resistive element varies, or permanent memory cells that do not cause a change in the resistance value of the variable resistive element through the voltage application and are fixed in a third data storage state that is read as the same logic level data as the first storage state, data to be written into the memory cell array being stored in at least one of the regular memory cells and at least one of the permanent memory cells in the memory cell array, the control circuit operative to rewrite at least one of the regular memory cells from the second data storage state to the first data storage state at the time of data holding, the control circuit operative to perform a reading operation after rewriting the regular memory cells from the first data storage state to the second data storage state at the time of data reading.

8. The nonvolatile semiconductor memory device according to claim 7, wherein
the data to be written into the memory cell array is written into a predetermined confidential data region of the memory cell array,
at the time of data holding, the control circuit rewrites all the regular memory cells in the confidential data region to the first data storage state, and
at the time of data reading, the control circuit performs a reading operation after rewriting all the rewritten regular memory cells from the first data storage state to the second data storage state.

9. The nonvolatile semiconductor memory device according to claim 8, wherein
at the time of data holding, the control circuit performs an operation to rewrite all the regular memory cells and the permanent memory cells in the confidential data region to the first data storage state, and
at the time of data reading, the control circuit performs a reading operation after performing an operation to rewrite all the regular memory cells and the permanent memory cells in the confidential data region to the second data storage state.

10. The nonvolatile semiconductor memory device according to claim 7, wherein
the control circuit further includes an arithmetic circuit that performs a calculating operation on data read from the memory cell array at the time of data reading and key data, and outputs a result of the calculating operation.

11. The nonvolatile semiconductor memory device according to claim 7, wherein
when rewriting at least one of the regular memory cells from the first data storage state to the second data storage state at the time of data reading, the control circuit selects the at least one of the regular memory cells based on predetermined operation data, the at least one of the regular memory cells being rewritten to the second data storage state.

12. The nonvolatile semiconductor memory device according to claim 7, wherein
the control circuit further includes a special command control circuit that enables an operation to read data from the memory cell array only when a special command is input.

13. The nonvolatile semiconductor memory device according to claim 7, wherein
the regular memory cells are in the first data storage state when the variable resistive element is in a low-resistance state,
the regular memory cells are in the second data storage state when the variable resistive element is in a high-resistance state, and
the variable resistive element is constantly in a low-resistance state in the permanent memory cells.

14. A nonvolatile semiconductor memory device comprising:
a memory cell array having an arrangement of NAND cell units, each of the NAND cell units including a memory string including a plurality of memory cells connected in series and select transistors connected to both ends of the memory string;
word lines connected to control gate electrodes of the memory cells;
bit lines connected to first end portions of the NAND cell units;
source lines connected to second end portions of the NAND cell units; and
a control circuit configured to control data rewriting into the memory cell array, data holding in the memory cell array, and data reading from the memory cell array, by applying a predetermined voltage to selected bit lines and selected word lines,
the memory cells being regular memory cells that are capable of switching between a first data storage state and a second data storage state when the predetermined voltage is applied to the bit lines and the word lines and a threshold voltage varies, or permanent memory cells that do not cause a change in the threshold voltage through the voltage application to the bit lines and the word lines, and are fixed in a third data storage state that is read as the same logic level data as the first storage state,
data to be written into the memory cell array being stored in at least one of the regular memory cells and at least one of the permanent memory cells in the memory cell array,
the control circuit operative to rewrite at least one of the regular memory cells from the second data storage state to the first data storage state at the time of data holding,
the control circuit operative to perform a reading operation after rewriting the regular memory cells from the first data storage state to the second data storage state at the time of data reading.

15. The nonvolatile semiconductor memory device according to claim 14, wherein
the data to be written into the memory cell array is written into a predetermined confidential data region of the memory cell array,
at the time of data holding, the control circuit rewrites all the regular memory cells in the confidential data region to the first data storage state, and
at the time of data reading, the control circuit performs a reading operation after rewriting all the rewritten regular memory cells from the first data storage state to the second data storage state.

16. The nonvolatile semiconductor memory device according to claim 15, wherein
at the time of data holding, the control circuit performs an operation to rewrite all the regular memory cells and the permanent memory cells in the confidential data region to the first data storage state, and at the time of data reading, the control circuit performs a reading operation after performing an operation to rewrite all the regular memory cells and the permanent memory cells in the confidential data region to the second data storage state.

17. The nonvolatile semiconductor memory device according to claim 14, wherein
the control circuit further includes an arithmetic circuit that performs a calculating operation on data read from the memory cell array at the time of data reading and key data, and outputs a result of the calculating operation.

18. The nonvolatile semiconductor memory device according to claim 14, wherein
when rewriting at least one of the regular memory cells from the first data storage state to the second data storage state at the time of data reading, the control circuit selects the at least one of the regular memory cells based on predetermined operation data, the at least one of the regular memory cells being rewritten to the second data storage state.

19. The nonvolatile semiconductor memory device according to claim 14, wherein
the control circuit further includes a special command control circuit that enables an operation to read data from the memory cell array only when a special command is input.

20. The nonvolatile semiconductor memory device according to claim 14, wherein
the regular memory cells are in the first data storage state when electrons are released from each floating gate and a threshold voltage is low,
the regular memory cells are in the second data storage state when electrons are injected into each floating gate and the threshold voltage is high, and
the permanent memory cells are in a state in which electrons are not to be injected into each floating gate and the threshold voltage is low.

* * * * *